(12) United States Patent
Mitsuhira et al.

(10) Patent No.: US 7,858,490 B2
(45) Date of Patent: Dec. 28, 2010

(54) SEMICONDUCTOR DEVICE HAVING DUAL-STI AND MANUFACTURING METHOD THEREOF

(75) Inventors: Noriyuki Mitsuhira, Tokyo (JP); Takehiko Nakahara, Tokyo (JP); Yasusuke Suzuki, Tokyo (JP); Jun Sumino, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 85 days.

(21) Appl. No.: 12/076,038

(22) Filed: Mar. 13, 2008

(65) Prior Publication Data

US 2008/0213971 A1    Sep. 4, 2008

Related U.S. Application Data

(62) Division of application No. 11/200,262, filed on Aug. 10, 2005, now abandoned.

(30) Foreign Application Priority Data

Aug. 12, 2004  (JP) ............... 2004-235434
Jul. 25, 2005  (JP) ............... 2005-214776

(51) Int. Cl.
*H01L 21/76* (2006.01)
(52) U.S. Cl. ............... 438/427; 257/E21.546
(58) Field of Classification Search ........ 257/427, 257/E21.546; 438/427
See application file for complete search history.

(56) References Cited

U.S. PATENT DOCUMENTS

| 5,536,675 | A | 7/1996 | Bohr |
| 6,410,452 | B2 | 6/2002 | Nishioka |

(Continued)

FOREIGN PATENT DOCUMENTS

| JP | 05-121537 | 5/1993 |
| JP | 2001-044273 A | 2/2001 |
| JP | 2001-128038 A | 5/2001 |
| JP | 2004-128038 A | 4/2004 |

OTHER PUBLICATIONS

Chinese Office Action, w/ English translation thereof, issued in Patent Application No. CN 2005100914776 dated on Nov. 7, 2008.
Keeney, Stephen, N. "A 130nm Generation High Density Etox™ Flash Memory Technology." 2001 International Electron Devices Meeting, p. 11 [online] URL: ftp://download.intel.com/research/silicon/.13micronflash_pres.pdf.

*Primary Examiner*—Bradley K Smith
*Assistant Examiner*—Mohammad T Karimy
(74) *Attorney, Agent, or Firm*—McDermott Will & Emery LLP

(57) ABSTRACT

A semiconductor device having a memory cell area and a peripheral circuit area includes a silicon substrate and an isolation structure implemented by a silicon oxide film formed on a surface of the silicon substrate. A depth of the isolation structure in the memory cell area is smaller than a depth of the isolation structure in the peripheral circuit area, and an isolation height of the isolation structure in the memory cell area is substantially the same as an isolation height of the isolation structure in the peripheral circuit area. Reliability of the semiconductor device can thus be improved.

4 Claims, 16 Drawing Sheets

U.S. PATENT DOCUMENTS

| | | | |
|---|---|---|---|
| 6,624,022 B1 * | 9/2003 | Hurley et al. | 438/256 |
| 2001/0036705 A1 | 11/2001 | Nishida et al. | |
| 2002/0070421 A1 * | 6/2002 | Ashburn et al. | 257/510 |
| 2003/0211702 A1 | 11/2003 | Parat et al. | |
| 2004/0048433 A1 | 3/2004 | Takahashi | |
| 2004/0164375 A1 | 8/2004 | Tsukamoto et al. | |

* cited by examiner

SEMICONDUCTOR DEVICE HAVING DUAL-STI AND MANUFACTURING METHOD THEREOF

RELATED APPLICATIONS

This application is a Divisional of U.S. application Ser. No. 11/200,262, filed Aug. 10, 2005, now abandoned claiming priority of Japanese Application Nos. 2004-235434, filed Aug. 12, 2004, and 2005-214776, filed Jul. 25, 2005, the entire contents of each of which are hereby incorporated by reference.

BACKGROUND OF THE INVENTION

1. Field of the Invention

The present invention relates to a semiconductor device and a manufacturing method thereof, and more particularly to a semiconductor device having Dual-STI (Shallow Trench Isolation) and a manufacturing method thereof 2. Description of the Background Art In order to achieve smaller size or high speed of a semiconductor element, a distance between isolation structures should be narrowed. As a conventional method of forming an element isolation area, LOCOS (local oxidation of silicon) has commonly been employed, however, LOCOS cannot sufficiently meet such demand for a smaller size. Accordingly, STI has recently been employed instead of LOCOS.

According to a conventional method of manufacturing an STI, initially, a silicon oxide film, polysilicon, and a silicon nitride film are stacked on a semiconductor substrate such as a silicon substrate. Thereafter, a resist having an opening for an element isolation area is formed by photolithography. Using this resist as a mask, the silicon oxide film, the polysilicon, the silicon nitride film, and the semiconductor substrate are anisotropically etched, so as to form a trench (groove). After the resist is removed, a silicon oxide film is deposited on an entire surface by using, for example, HDP (High density plasma)-CVD (Chemical Vapor Deposition). Extra silicon oxide film is removed by CMP (Chemical Mechanical Polishing) using the silicon nitride film as a stopper, and an STI having a trench embedded with the silicon oxide film is formed.

In a semiconductor device such as a DRAM (Dynamic Random Access Memory), a withstand voltage in isolation is different between a memory cell area and a peripheral circuit area. Specifically, as an applied voltage is lower in the memory cell area than in the peripheral circuit area, the withstand voltage in isolation required in the STI in the memory cell area is low. Therefore, the depth of the STI in the memory cell area is made smaller than that in the peripheral circuit area, so that an area occupied by the memory cell area is decreased. In this manner, a structure in which a depth of the STI is different between areas is referred to as Dual-STI.

Conventionally, Dual-STI has normally been formed in the following manner. Initially, a shallow trench portion is formed in the memory cell area and the peripheral circuit area with the conventional method of manufacturing the STI. Thereafter, the memory cell area is covered with a resist. Using the resist and a silicon nitride film as a mask, the semiconductor substrate is anisotropically etched, so as to form a deep trench portion within the shallow trench portion in the peripheral circuit area. After the resist is removed, the silicon oxide film is deposited on the entire surface. Extra silicon oxide film is removed by CMP, using the silicon nitride film as a stopper, so as to form Dual-STI having the shallow trench portion and the deep trench portion embedded with the silicon oxide film. After the Dual-STI is formed, the silicon oxide film, polysilicon, and the silicon nitride film formed on the silicon substrate are removed.

Japanese Patent Laying-Open No. 05-121537 discloses a technique to form a shallow trench portion in a collector isolation area and to form a deep trench portion in an element isolation area. According to Japanese Patent Laying-Open No. 05-121537, a mask pattern having a width in the collector isolation area smaller than that in the element isolation area is formed, and the semiconductor substrate is etched utilizing a characteristic that etching progresses slowly in a narrow portion.

In addition, Japanese Patent Laying-Open No. 2001-044273 discloses a method of forming an STI using a TEOS (Tetra Ethyl Ortho Silicate) film. According to Japanese Patent Laying-Open No. 2001-044273, a pad oxide film, a silicon nitride film, and a TEOS film are stacked on the silicon substrate. Using a resist formed on the TEOS film as a mask, the pad oxide film, the silicon nitride film, and the TEOS film are etched. After the resist is removed, the silicon substrate is etched using the TEOS film as a mask, so as to form a trench.

Moreover, in Stephen N. Keeney, "A 130 nm Generation High Density Etox™ Flash Memory Technology," page 11. [online]; <URL: ftp://download.intel.com/research/silicon/0.13micronflash_pres.pdf>, an example of a flash memory using Dual-STI is shown.

As described above, according to the conventional method of forming Dual-STI, the memory cell area is covered with the resist. Using the resist and the silicon nitride film as a mask, the semiconductor substrate is anisotropically etched, so as to form the deep trench portion in the peripheral circuit area. In forming the deep trench portion, the silicon nitride film formed in the memory cell area is covered with the resist. On the other hand, as the silicon nitride film formed in the peripheral circuit area serves as the mask during etching, it is not covered with the resist. Therefore, a part of the silicon nitride film formed in the peripheral circuit area is anisotropically etched, and a film thickness of the silicon nitride film in the peripheral circuit area becomes smaller than that in the memory cell area.

When the film thickness of the silicon nitride film in the peripheral circuit area becomes smaller than that in the memory cell area, reliability of a semiconductor device is lowered. Such a disadvantage will be described in the following.

When the film thickness of the silicon nitride film in the peripheral circuit area is smaller than that in the memory cell area, extra silicon oxide film remains particularly in a stepped portion at a boundary between the memory cell area and the peripheral circuit area in removing extra silicon oxide film on the silicon nitride film by using CMP. Thereafter, in removing the silicon nitride film or the like formed on the silicon substrate, remaining silicon oxide film serves as a mask, and the silicon nitride film or a polysilicon film under the silicon oxide film cannot be removed. Consequently, a defect such as generation of a foreign matter, short-circuiting, or defective shape is caused, resulting in lower reliability of a semiconductor device.

In addition, as an isolation height of the STI is defined by the silicon nitride film serving as a stopper film at the time of CMP, the isolation height of the STI in the peripheral circuit area becomes lower than that in the memory cell area. If the isolation height of the STI in the peripheral circuit area is lower than that in the memory cell area, films to be etched on the STI stepped portion will have different thicknesses when a conductive film serving as an electrode for forming an element such as a transistor is subsequently formed. Therefore, when this film is patterned, the conductive film may remain at the STI stepped portion or an underlying layer may be removed, which results in lower reliability of a semiconductor device.

According to the technique disclosed in Japanese Patent Laying-Open No. 05-121537, the depth is uniquely determined based on the width of the trench. Therefore, restriction in terms of layout is imposed on fabrication of the deep trench portion and the shallow trench portion. In addition, as this publication is silent about the isolation height, the problem as described above cannot be solved.

In addition, the technique disclosed in Japanese Patent Laying-Open No. 2001-044273 is not directed to manufacturing of Dual-STI in which a deep trench portion and a shallow trench portion having depths different from each other are formed. Therefore, this publication cannot solve the problem as described above.

Moreover, according to the technique disclosed in Stephen N. Keeney, "A 130 nm Generation High Density Etox™ Flash Memory Technology," page 11. [online]; <URL: ftp://download.intel.com/research/silicon/0.13micronflash_pres.pdf>, the isolation structure height in the deep trench portion is smaller than that in the shallow trench portion. Therefore, the problem as described above cannot be solved. This publication discloses no means for solving the problem of extra silicon oxide film remaining in the stepped portion at the boundary between the memory cell area and the peripheral circuit area.

SUMMARY OF THE INVENTION

An object of the present invention is to provide a semiconductor device capable of achieving improvement in reliability, as well as a manufacturing method thereof A semiconductor device according to the present invention has a first area and a second area. The semiconductor device includes a silicon substrate, and an isolation structure implemented by a silicon insulating film formed on a surface of the silicon substrate. A depth of the isolation structure in the first area is smaller than that in the second area, and an isolation height of the isolation structure in the first area is substantially the same as that in the second area.

A method of manufacturing a semiconductor device having a first area and a second area according to the present invention includes the steps of: forming a first silicon insulating film over a silicon substrate; forming a first trench in the first silicon insulating film and the silicon substrate in the first and second areas; forming a mask layer in the first trench formed in the first area and on the first silicon insulating film in the first area; etching the silicon substrate using the mask layer and the first silicon insulating film as a mask so as to form a second trench in the first trench in the second area; removing the mask layer; forming a second silicon insulating film on the first silicon nitride film so as to bury the first and second trenches; and removing the first and second silicon insulating films over the silicon substrate so as to form an isolation structure in the first and second trenches.

The "isolation height of the isolation structure" herein refers to a height of an isolation structure from the surface of the silicon substrate to a highest position of the isolation structure. When a conductive film such as a gate electrode is normally formed on the isolation structure, in many cases, the height of the isolation structure does not decrease at that position in a process in a subsequent step. Meanwhile, the "depth of the isolation structure" refers to a depth of an isolation structure from the surface of the silicon substrate to a deepest position of the isolation structure.

According to the semiconductor device and the manufacturing method of the present invention, the isolation height of the isolation structure in the first area is substantially the same as that in the second area. Therefore, reliability of the semiconductor device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

First Embodiment

Figure 1:
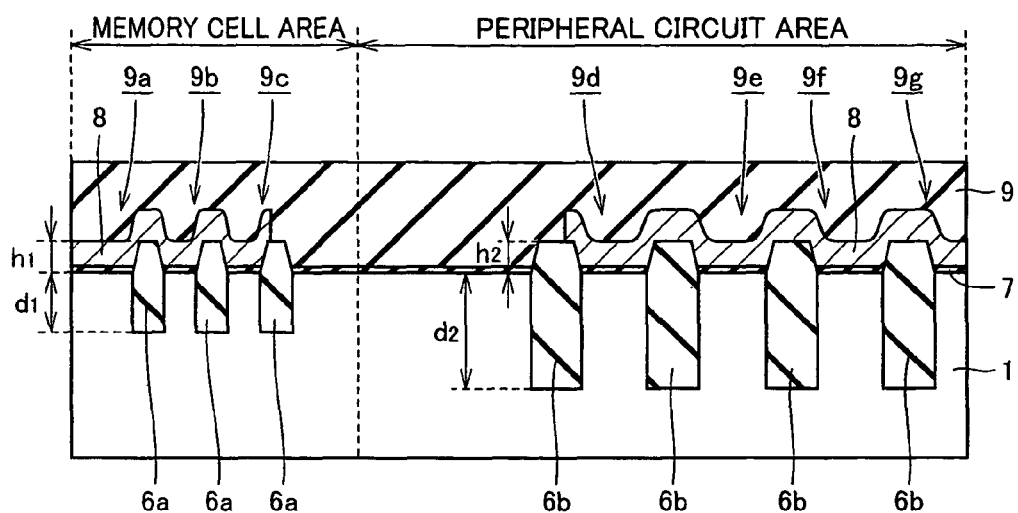
FIG. 1 is a cross-sectional view of a structure of a semiconductor device in a first embodiment of the present invention.

As shown in FIG. 1, a semiconductor device according to the present embodiment includes a memory cell area serving as a first area and a peripheral circuit area serving as a second area. The semiconductor device according to the present embodiment includes a silicon substrate 1 and a plurality of isolation structures 6a, 6b formed on the surface of silicon substrate 1. A plurality of isolation structures 6a are formed on the surface of silicon substrate 1 in the memory cell area, while a plurality of isolation structures 6b are formed on the surface of silicon substrate 1 in the peripheral circuit area. Isolation structures 6a, 6b are implemented by a silicon oxide film. A depth $d_1$ of isolation structure 6a is smaller than a depth $d_2$ of isolation structure 6b. That is, the semiconductor device according to the present embodiment has a Dual-STI structure. In the semiconductor device according to the present embodiment, an isolation height $h_1$ of isolation structure 6a is substantially the same as an isolation height $h_2$ of isolation structure 6b. When viewed two-dimensionally, a trench width of isolation structure 6a is smaller than that of isolation structure 6b.

For example, gate electrodes 8 for transistors 9a to 9g are formed on silicon substrate 1, with a gate insulating film 7 being interposed. Each of transistors 9a to 9g is electrically isolated from each other by the plurality of isolation structures 6a, 6b. Not-shown source region and drain region of transistors 9a to 9g are formed on the surface of silicon substrate 1 on opposing sides of gate electrode 8 of each transistor 9a to 9g, respectively. In this manner, semiconductor elements such as transistors 9a to 9g are isolated by each of the plurality of isolation structures 6a, 6b. It is noted that an interlayer insulating film 9 is formed to cover gate electrode 8. In addition, a boundary between the memory cell area and the peripheral circuit area is present on an active region, which is formed to two-dimensionally surround the memory cell area as a dummy pattern.

A method of manufacturing the semiconductor device according to the present embodiment will now be described with reference to FIGS. 2 to 8.

Figure 2:
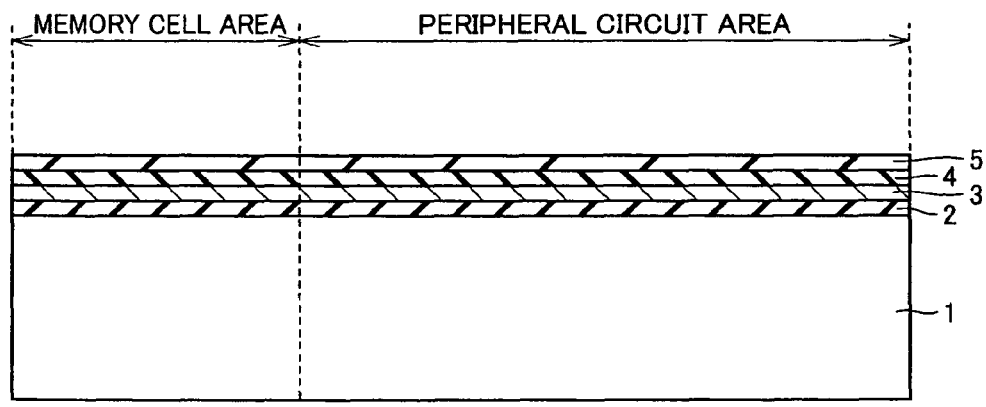
FIGS. 2 to 8 are cross-sectional views sequentially showing a method of manufacturing a semiconductor device in the first embodiment of the present invention.

Initially, as shown in FIG. 2, an underlying oxide film 2 implemented by the silicon oxide film is formed on silicon substrate 1 to a thickness of approximately 5 to 30 nm, for example, by thermal oxidation. Then, a polysilicon film 3 is formed on underlying oxide film 2 to a thickness of approximately 100 to 300 nm, for example, by CVD. In succession, a silicon nitride film 4 is formed on polysilicon film 3, for example, by CVD. In addition, a silicon oxide film 5 (a first silicon oxide film) composed, for example, of TEOS is formed on silicon nitride film 4.

Though the present embodiment shows an example in which polysilicon film 3 is formed, an amorphous silicon film may be formed instead of polysilicon film 3, or alternatively polysilicon film 3 may not be formed. In addition, though the present embodiment shows an example in which silicon oxide film 5 is implemented by TEOS, a silicon insulating film other than TEOS may be employed provided that a polished rate of the film in CMP is close to that of an isolation/insulating film such as a silicon oxide film embedding a trench which will be described later.

Figure 3:
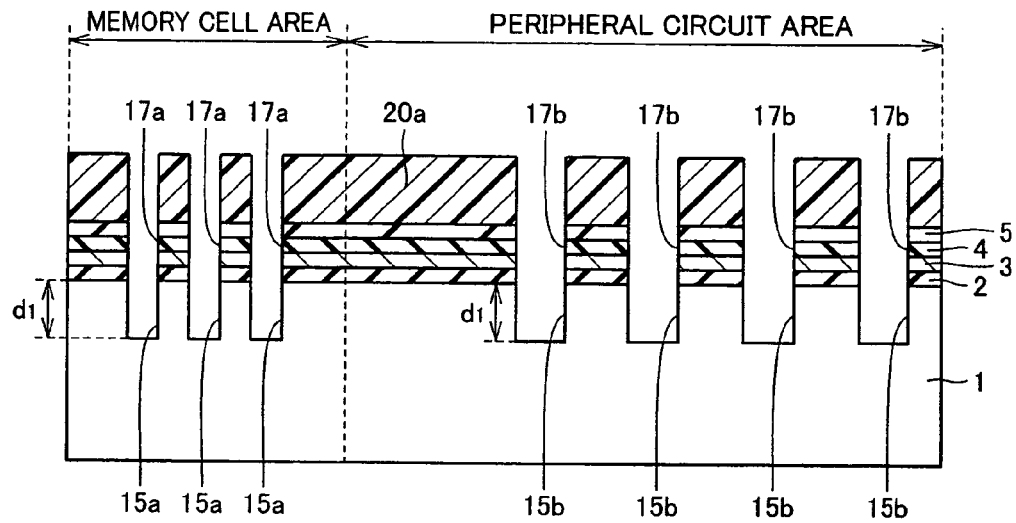

Thereafter, as shown in FIG. 3, a resist 20a having a prescribed shape is formed on silicon oxide film 5. Then, using resist 20a as a mask, silicon oxide film 5, silicon nitride film 4, polysilicon film 3, and underlying oxide film 2 are anisotropically etched, and silicon substrate 1 is anisotropically etched to depth $d_1$. Here, depth $d_1$ is set, for example, to approximately 100 to 500 nm. In this manner, a plurality of trenches 15a, 15b (first trench) are formed on the surface of silicon substrate 1. A plurality of trenches 15a are formed on the surface of silicon substrate 1 in the memory cell area, while a plurality of trenches 15b are formed on the surface of silicon substrate 1 in the peripheral circuit area. In addition, sidewall portions 17a, 17b continuing to respective wall portions of trenches 15a, 15b are formed through silicon oxide film 5, silicon nitride film 4, polysilicon film 3, and underlying oxide film 2. Thereafter, resist 20a is removed.

Figure 4:
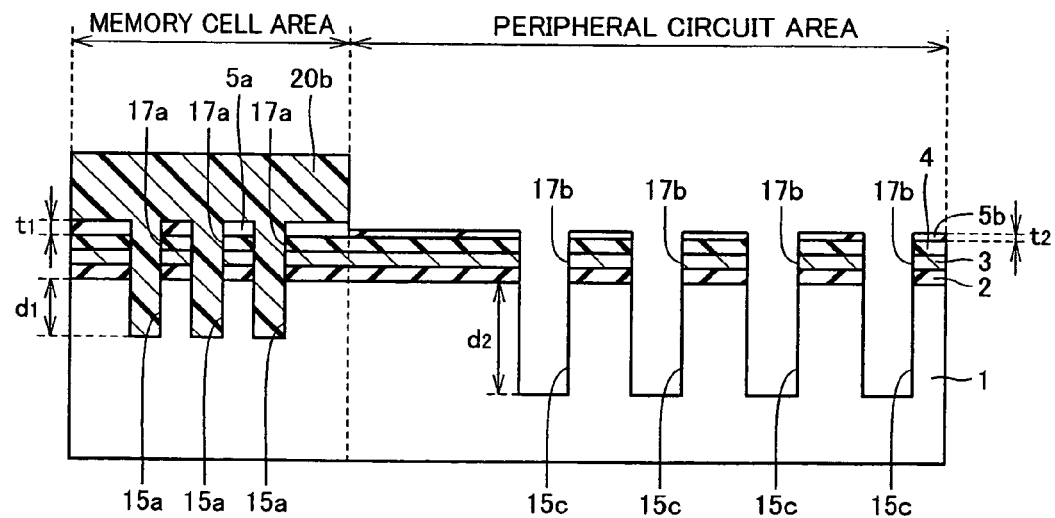

Thereafter, as shown in FIG. 4, a resist 20b is formed in trench 15a formed in the memory cell area and on silicon oxide film 5 in the memory cell area. Using resist 20b and silicon oxide film 5 as a mask, silicon substrate 1 is anisotropically etched. Then a trench 15c having a depth $d_2$ is formed in trench 15b in the peripheral circuit area. When silicon substrate 1 is anisotropically etched, an optimal condition for etching silicon substrate 1 is employed, however, silicon oxide film 5 serving as the mask is etched to some extent. Consequently, a thickness $t_2$ of a silicon oxide film 5b in the peripheral circuit area becomes smaller than a thickness $t_1$ of a silicon oxide film 5a in the memory cell area. Thereafter, resist 20b is removed.

Figure 5:
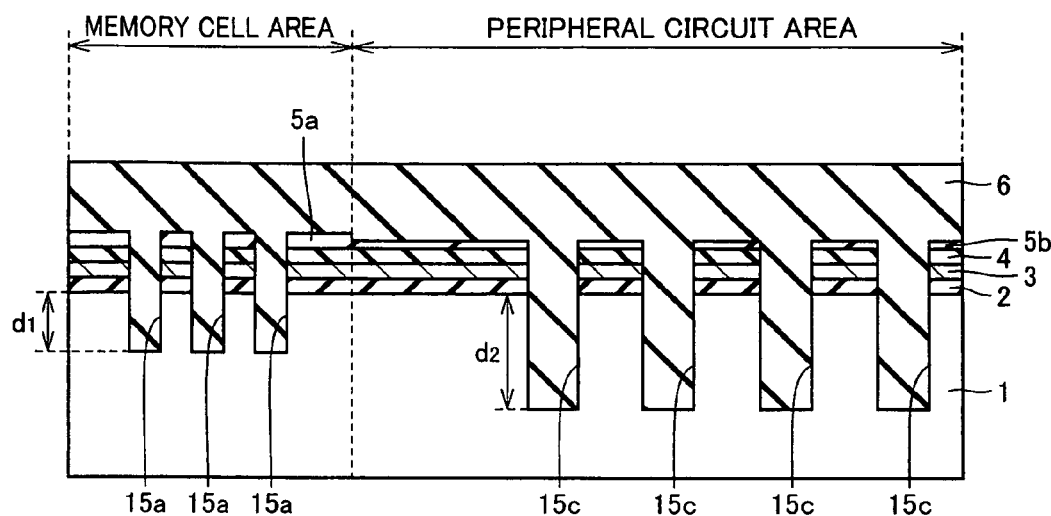

Thereafter, as shown in FIG. 5, respective inner walls of trenches 15a, 15c are oxidized, and a second silicon oxide film 6 is formed on silicon oxide films 5a, 5b by plasma CVD such as HDP, so as to bury trenches 15a, 15c. Here, in oxidizing the inner walls of trenches 15a, 15c, polysilicon film 3 is oxidized from the side. Therefore, bird's beak of the isolation structure can be extended and isolation structure characteristic can be improved.

Though an example in which second silicon oxide film 6 resulted from HDP is formed as the isolation/insulating film is shown in the present embodiment, a silicon oxide film obtained by applying NSG (Non-doped Silicate Glass) may be formed instead of the silicon oxide film resulted from HDP. In summary, a silicon oxide film should be formed.

Figure 6:
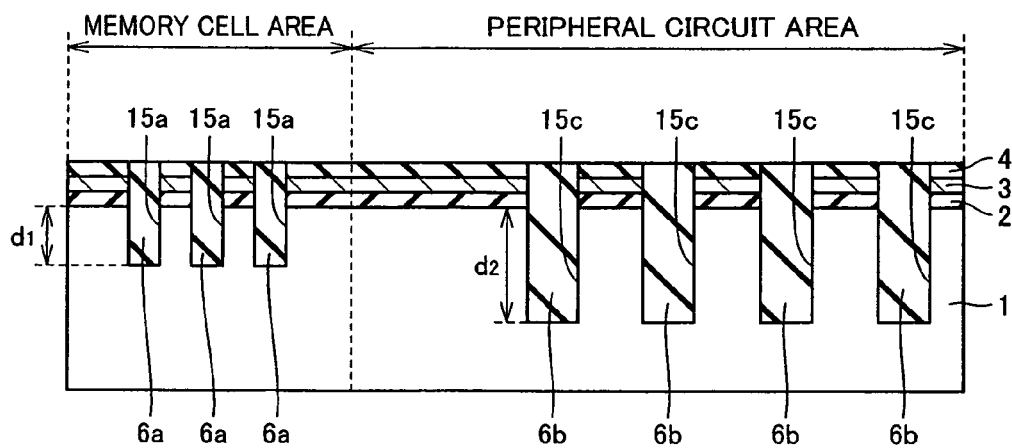

Thereafter, as shown in FIG. 6, silicon oxide film 5 and extra second silicon oxide film 6 on silicon nitride film 4 are removed by CMP. Then, isolation structures 6a, 6b are formed in trenches 15a, 15c, respectively. A plurality of isolation structures 6a are formed in the memory cell area, while a plurality of isolation structures 6b are formed in the peripheral circuit area.

Here, the polished speed of silicon oxide films 5a, 5b is substantially equal to the polished speed of second silicon oxide film 6. Therefore, even if thickness $t_2$ of silicon oxide film 5b is smaller than thickness $t_1$ of silicon oxide film 5a in the memory cell area, the polished speed in the memory cell area is substantially the same as that in the peripheral circuit area. In addition, as the polished speed of the silicon nitride film is approximately 1/300 of the polished speed of silicon oxide films 5a, 5b and second silicon oxide film 6, silicon nitride film 4 serves as the etching stopper film in CMP. In this manner, silicon oxide films 5a, 5b and extra second silicon oxide film 6 on silicon nitride film 4 can completely be removed. Moreover, the surfaces of isolation structures 6a, 6b exposed on the surface of silicon nitride film 4 are substantially flush with each other, and flush with the surface of silicon nitride film 4. In other words, upper surfaces of isolation structures 6a, 6b are substantially flush with the upper surface of silicon nitride film 4.

Figure 7:
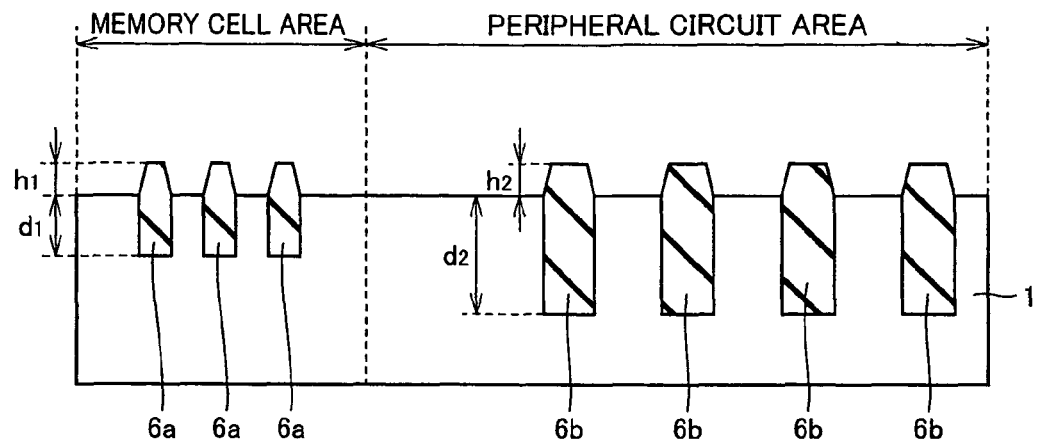

Thereafter, as shown in FIG. 7, respective surfaces of isolation structures 6a, 6b are subjected to wet-etching, for example, by using hydrofluoric acid, so that isolation structures 6a, 6b attain prescribed isolation heights $h_1$, $h_2$ respectively. Here, as the surfaces of isolation structures 6a, 6b are made substantially flush with each other in the preceding step, isolation height $h_1$ of isolation structure 6a is substantially the same as isolation height $h_2$ of isolation structure 6b after wet-etching. That is, the upper surface of isolation structure 6a is flush with the upper surface of isolation structure 6b. In succession, silicon nitride film 4, polysilicon film 3, and underlying oxide film 2 are removed by etching, so as to expose silicon substrate 1. In this manner, a plurality of isolation structures 6a, 6b protruding upward from the surface of silicon substrate 1 are formed.

Figure 8:
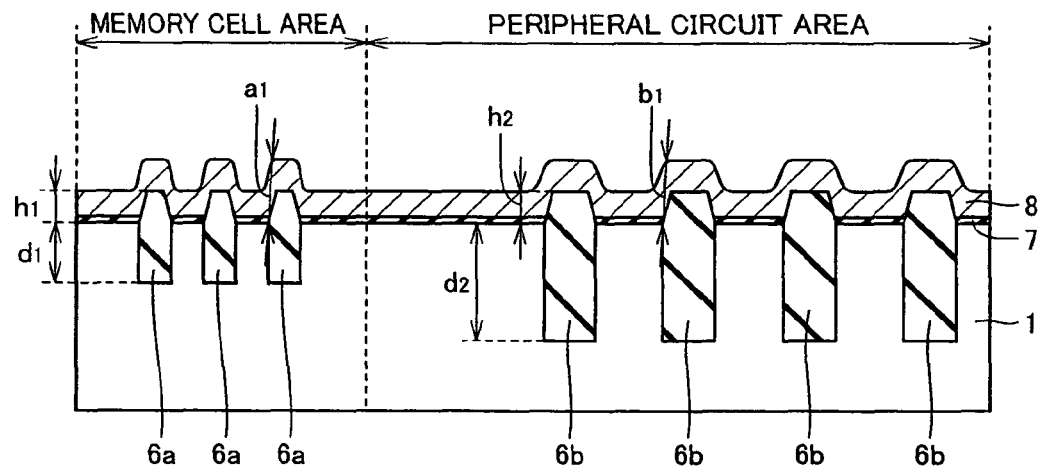

Thereafter, as shown in FIG. 8, gate insulating film 7 is formed on the surface of silicon substrate 1 with thermal oxidation. Thereafter, a polysilicon film 8 is formed, for example, by CVD, so as to cover gate insulating film 7 and each of the plurality of isolation structures 6a, 6b. When a film is formed on an isolation structure by CVD and if the height of the isolation structure is high, a film in the vicinity of the isolation structure also has a large film thickness. In the present embodiment, isolation height $h_1$ of isolation structure 6a is substantially the same as isolation height $h_2$ of isolation structure 6b. Therefore, a thickness $a_1$ of polysilicon film 8 in the vicinity of isolation structure 6a is substantially the same as a thickness $b_1$ of polysilicon film 8 in the vicinity of isolation structure 6b.

Thereafter, as shown in FIG. 1, polysilicon film 8 is etched to achieve a prescribed pattern, so as to form gate electrode 8 of each of transistors 9a to 9g. As described previously, thickness $a_1$ of polysilicon film 8 in the vicinity of isolation structure 6a is substantially the same as thickness $b_1$ of polysilicon film 8 in the vicinity of isolation structure 6b. Therefore, during etching, etching of the silicon substrate as a result of etching through gate insulating film 7 in the peripheral circuit area is avoided, or polysilicon film 8 is not left in the memory cell area. Thereafter, interlayer insulating film 9 is formed so as to cover gate electrode 8. The semiconductor device according to the present embodiment is completed through the above-described steps.

The semiconductor device according to the present embodiment has the memory cell area and the peripheral circuit area. The semiconductor device includes silicon substrate 1 and isolation structures 6a, 6b implemented by second silicon oxide film 6 formed on the surface of silicon substrate 1. Depth $d_1$ of isolation structure 6a in the memory cell area is smaller than depth $d_2$ of isolation structure 6b in the peripheral circuit area, and isolation height $h_1$ of isolation structure 6a in the memory cell area is substantially the same as isolation height $h_2$ of isolation structure 6b in the peripheral circuit area. That is, the upper surface of isolation structure 6a is substantially flush with the upper surface of isolation structure 6b.

The method of manufacturing a semiconductor device having the memory cell area and the peripheral circuit area according to the present embodiment includes the following steps. Silicon oxide film 5 is formed on silicon substrate 1. Trenches 15a, 15b are formed in silicon oxide film 5 and silicon substrate 1 in the memory cell area and the peripheral circuit area respectively. Resist 20b is formed in trench 15a formed in the memory cell area and on silicon oxide film 5 in the memory cell area. Silicon substrate 1 is etched, using resist 20b and silicon oxide film 5 as a mask, so as to form trench 15c in trench 15b in the peripheral circuit area. Resist 20b is removed. Second silicon oxide film 6 is formed on silicon oxide films 5a, 5b so as to bury trenches 15a, 15c. Silicon oxide films 5a, 5b and second silicon oxide film 6 on silicon substrate 1 are removed, so as to form isolation structures 6a, 6b in trenches 15a, 15c respectively.

According to the semiconductor device and the manufacturing method thereof according to the present embodiment, isolation height $h_1$ of isolation structure 6a in the memory cell area is substantially the same as isolation height $h_2$ of isolation structure 6b in the peripheral circuit area. Specifically, when depth $d_1$ of isolation structure 6a is set to a value not smaller than 100 nm and less than 200 nm and depth $d_2$ of isolation structure 6b is set to not smaller than 200 nm and not larger than 400 nm, a difference between isolation height $h_1$ of isolation structure 6a and isolation height $h_2$ of isolation structure 6b can be made to not larger than 20 nm. In addition, if a dummy pattern is used or a two-dimensional layout of the semiconductor device is designed to an appropriate shape, the difference between isolation height $h_1$ of isolation structure 6a and isolation height $h_2$ of isolation structure 6b can be made to not larger than 5 nm. In this manner, uniform thickness of polysilicon film 8 formed on isolation structures 6a, 6b can be achieved. Therefore, margin in patterning polysilicon film 8 can be improved, and consequently, reliability of the semiconductor device can be improved.

According to the method of manufacturing a semiconductor device in the present embodiment, in forming trench 15c, silicon oxide film 5b instead of silicon nitride film 4 is used as a mask. As the polished speed of silicon oxide films 5a, 5b is substantially equal to the polished speed of second silicon oxide film 6, silicon oxide films 5a, 5b and extra second silicon oxide film 6 on silicon nitride film 4 can completely be removed even if a step is produced between silicon oxide films 5a, 5b. In addition, as silicon nitride film 4 has the uniform thickness, isolation height $h_1$ of isolation structure 6a in the memory cell area can substantially be the same as isolation height $h_2$ of isolation structure 6b in the peripheral circuit area. Reliability of the semiconductor device can thus be improved.

Here, a problem that arises in a conventional example in which silicon oxide film 5 is not formed on silicon nitride film 4 will be described in detail with reference to FIGS. 9 to 11.

Figure 9:
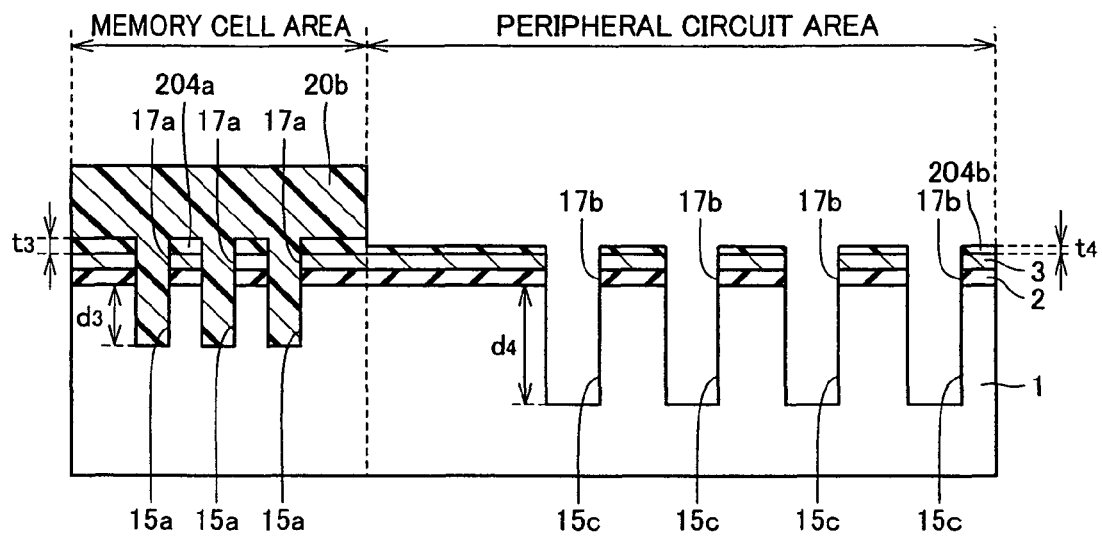
FIGS. 9 to 11 are cross-sectional views sequentially showing the method of manufacturing a semiconductor device when a silicon oxide film is not formed on a silicon nitride film.

As shown in FIG. 9, if silicon oxide film 5 is not formed, silicon substrate 1 is anisotropically etched using resist 20b and a silicon nitride film 204b as a mask. Here, silicon nitride film 204b in the peripheral circuit area is etched to some extent, and a thickness $t_4$ of silicon nitride film 204b becomes smaller than a thickness $t_3$ of a silicon nitride film 204a in the memory cell area. That is, a stepped portion is produced at the boundary between the memory cell area and the peripheral circuit area. More specifically, when a depth $d_3$ of an isolation structure 206a is set to a value not smaller than 100 nm and less than 200 nm and a depth $d_4$ of an isolation structure 206b is set to 200-400 nm, a difference of approximately 30 to 80 nm is produced between thickness $t_3$ of silicon nitride film 204a and thickness $t_4$ of silicon nitride film 204b.

Figure 10:
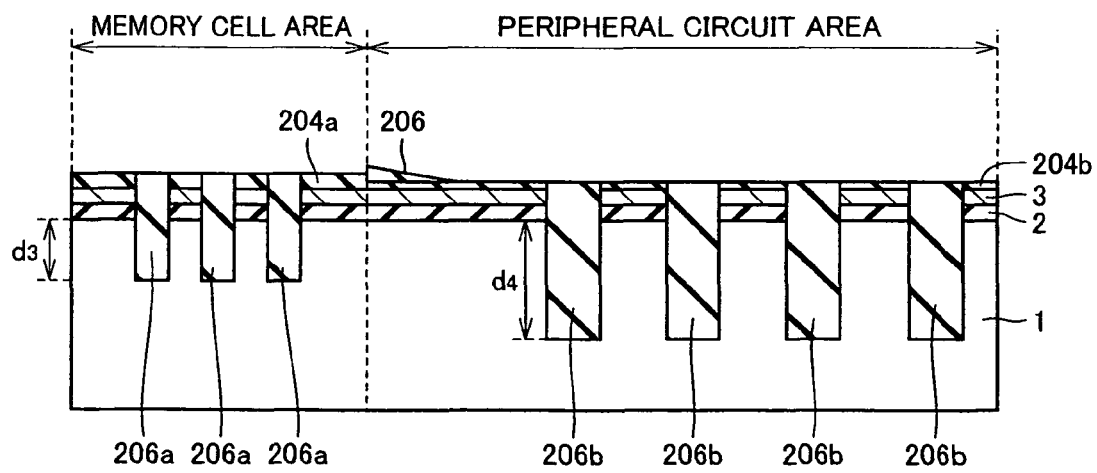

As shown in FIG. 10, if there is a stepped portion at the boundary between the memory cell area and the peripheral circuit area, second silicon oxide film 6 present at the stepped portion is not removed by CMP but remains as extra second silicon oxide film 206. In addition, the surface of isolation structure 206b in the peripheral circuit area becomes lower than the surface of isolation structure 206a in the memory cell area.

Figure 11:
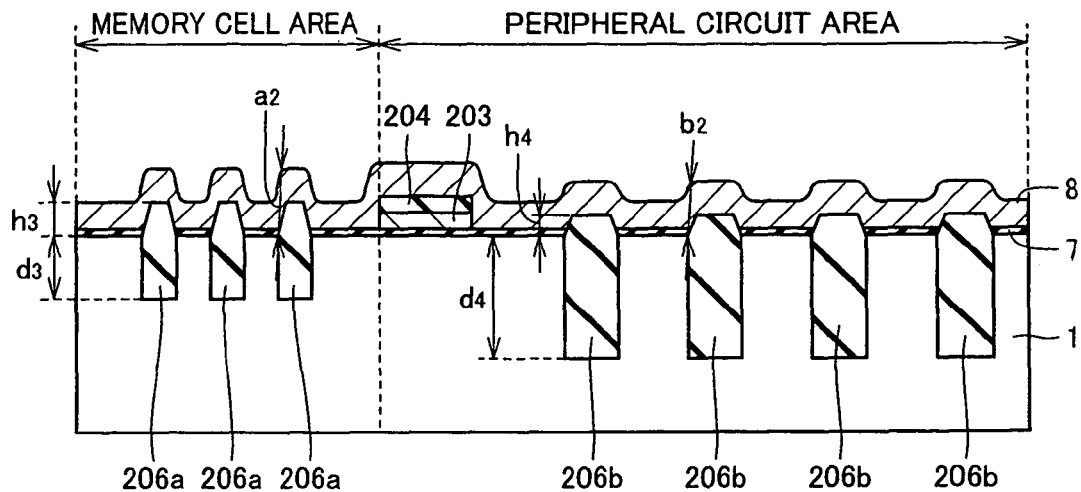

Referring to FIG. 11, if extra second silicon oxide film 206 is left at the stepped portion, second silicon oxide film 206 serves as a mask. Then, underlying silicon nitride film 4, polysilicon film 3 or the like cannot be removed, and they are left as extra silicon nitride film 204 and polysilicon film 203. Consequently, a defect such as generation of a foreign matter, short-circuiting, or defective shape is caused, resulting in lower reliability of a semiconductor device.

In addition, if the surface of isolation structure 206b is lower than the surface of isolation structure 206a, an isolation height $h_4$ of isolation structure 206b becomes lower than an isolation height $h_3$ of isolation structure 206a. More specifically, when depth $d_3$ of isolation structure 206a is set to a value not smaller than 100 nm and less than 200 nm and depth $d_4$ of isolation structure 206b is set to 200-400 nm, a difference of approximately 30 to 80 nm is produced between isolation height $h_3$ of isolation structure 206a and isolation height $h_4$ of isolation structure 206b. Moreover, if a gate oxide film in the peripheral circuit area is newly deposited, the difference is further increased.

Figure 12:
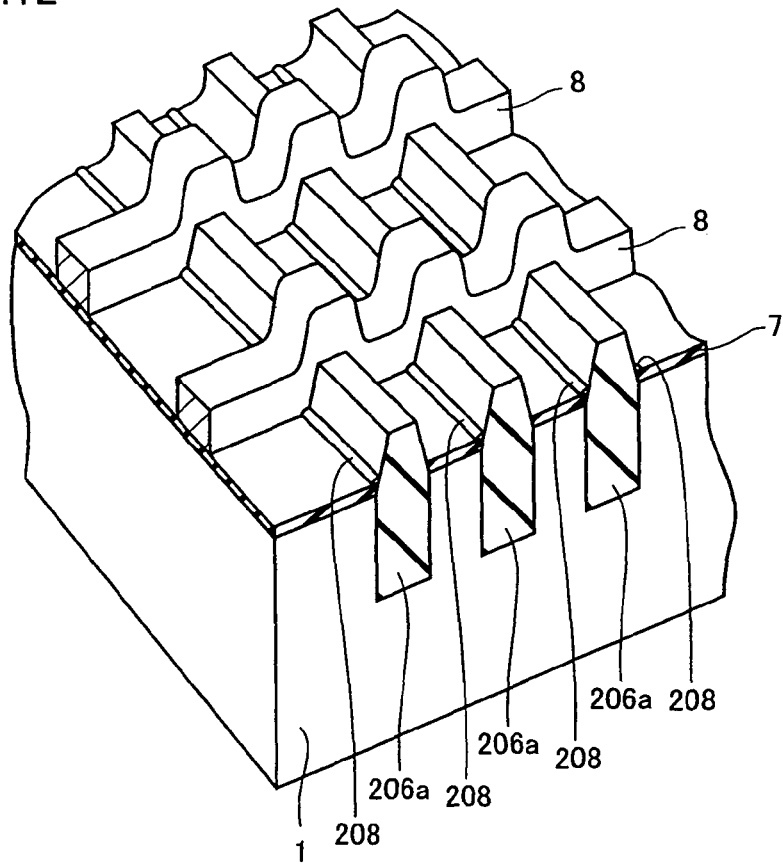
FIG. 12 is a perspective view of a state in which polysilicon remains at an end portion of an isolation structure in a memory cell area.

When polysilicon film 8 is formed while isolation height $h_4$ of isolation structure 206b is lower than isolation height $h_3$ of isolation structure 206a, a thickness $b_2$ of polysilicon film 8 in the vicinity of isolation structure 206b becomes smaller than a thickness $a_2$ of polysilicon film 8 in the vicinity of isolation structure 206a. Then, polysilicon film 8 cannot uniformly be etched, in which case, the silicon substrate may be etched as a result of etching through gate insulating film 7 in the peripheral circuit area, or a polysilicon film 208 may remain at an end portion of isolation structure 206a in the memory cell area, as shown in FIG. 12. Consequently, reliability of a semiconductor device is lowered. If height $h_3$ of isolation structure 206a in the memory cell area is set lower in order to avoid such a problem, the surface of isolation structure 206b in the peripheral circuit area becomes lower than the substrate surface. As a result, the gate electrode surrounds an end of an active region and a reverse narrow channel effect takes place, which results in lower threshold voltage. This may cause leakage current in a transistor.

According to the method of manufacturing a semiconductor device in the present embodiment, such a problem can be prevented and an isolation structure having an appropriate height can be formed. Therefore, reliability and performance of a semiconductor device can be improved.

According to the semiconductor device in the present embodiment, when viewed two-dimensionally, a trench width of isolation structure 6a in the memory cell area is smaller than that in the peripheral circuit area. Therefore, if the trench width of isolation structure 6a in the memory cell area is made smaller in order to reduce the element in size, insufficient burying with the insulating film implementing isolation structure 6a can be suppressed.

In the method of manufacturing a semiconductor device in the present embodiment, silicon nitride film 4 is formed on silicon substrate 1, and thereafter silicon oxide film 5 is formed. Accordingly, flat silicon nitride film 4 can serve as the etching stopper when silicon oxide film 5 is removed. In addition, silicon nitride film 4 can define isolation heights $h_1$, $h_2$ of isolation structures 6a, 6b respectively.

The gate insulating films in the memory cell area and in the peripheral circuit area are simultaneously formed in the present embodiment. For example, however, in forming gate insulating films having different film thicknesses in the peripheral circuit area, the gate insulating films are once removed and again deposited. Then, the height of the isolation structure may be slightly lower by a thickness of removed gate insulating film (approximately less than 10-30 nm). In an element area such as a capacitive element where an insulating film formed simultaneously with the gate insulating film of a memory cell is used also in the peripheral circuit area, the height of the isolation structure is substantially the same.

The height of the isolation structure in the present embodiment is preferably set to approximately 0 to 60 nm, and more preferably to approximately 20 to 40 nm.

Second Embodiment

Figure 13:
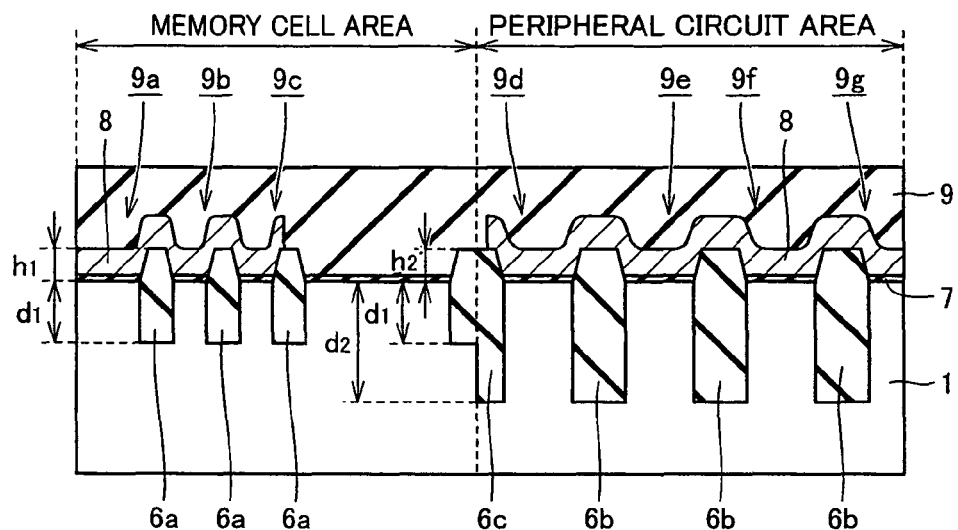
FIG. 13 is a cross-sectional view of a structure of a semiconductor device in a second embodiment of the present invention.

Referring to FIG. 13, in the semiconductor device according to the present embodiment, the boundary between the memory cell area and the peripheral circuit area is present on an isolation structure 6c. Isolation structure 6c has a portion in the memory cell area having depth $d_1$ and a portion in the peripheral circuit area having depth $d_2$, and there is a step at the boundary between the portion having depth $d_1$ and the portion having depth $d_2$.

Figure 14:
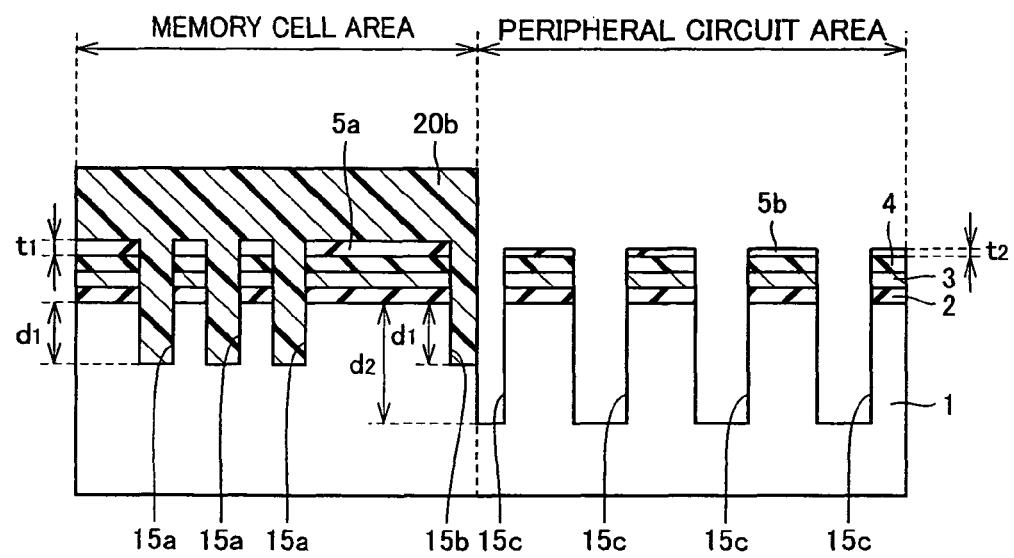
FIG. 14 is a cross-sectional view showing a step of manufacturing a semiconductor device in the second embodiment of the present invention.

Referring to FIG. 14, in the present embodiment, in forming resist 20b, resist 20b is formed also in a part of trench 15b formed at the boundary between the memory cell area and the peripheral circuit area. Using this resist 20b as a mask, anisotropic etching is performed. Consequently, in trench 15b formed at the boundary between the memory cell area and the peripheral circuit area, the portion where resist 20b is formed maintains depth $d_1$, while trench 15c having depth $d_2$ is formed in the portion where resist 20b is not formed. Trenches 15b and 15c thus formed are buried with second silicon oxide film 6, thereby obtaining the semiconductor device shown in FIG. 13.

As a semiconductor device other than the above and a manufacturing method thereof are substantially similar to the semiconductor device and the manufacturing method in the first embodiment shown in FIGS. 1 to 8, the same components have the same reference characters allotted, and detailed description thereof will not be repeated.

In the semiconductor device according to the present embodiment, the boundary between the memory cell area and the peripheral circuit area is present on isolation structure 6c.

According to the method of manufacturing the semiconductor device in the present embodiment, when resist 20b is formed, resist 20b is formed in a part of trench 15b.

According to the semiconductor device and the method of manufacturing the same in the present embodiment, an effect similar to that in the first embodiment can also be obtained. In addition, in the semiconductor device in the first embodiment, the active region at the boundary between the memory cell area and the peripheral circuit area serves as a dummy pattern. In the present embodiment, however, the dummy pattern is not necessary or can be made smaller, and therefore an element area can further be reduced.

In the first and second embodiments, isolation structures having two types of depths, that is, isolation structure 6a having depth $d_1$ and isolation structure 6b having depth $d_2$, are formed, however, the present invention is not limited as such. Alternatively, isolation structures set to a plurality of depths may be formed. Specifically, isolation structures having three or four types of depths may be formed.

Third Embodiment

In the present embodiment, an exemplary semiconductor device including a memory cell (flash memory) will be described.

Initially, a structure of the semiconductor device according to the present embodiment will be described with reference to FIGS. 15 to 21.

Figure 16:
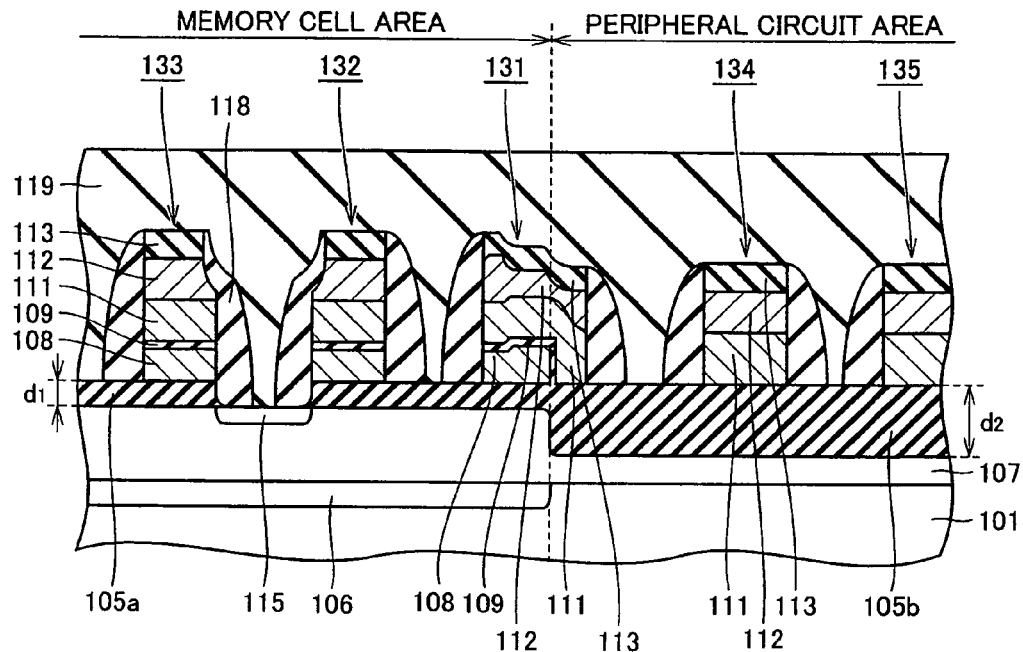
FIG. 16 is a cross-sectional view along the line XVI-XVI in FIG. 15.
Figure 17:
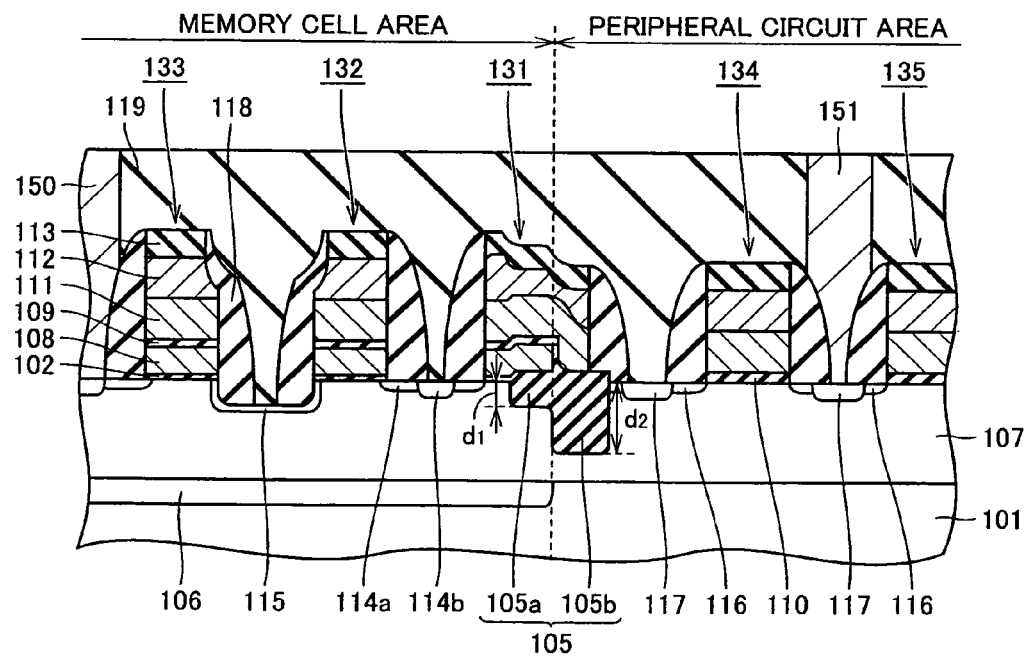
FIG. 17 is a cross-sectional view along the line XVII-XVII in FIG. 15.
Figure 18:
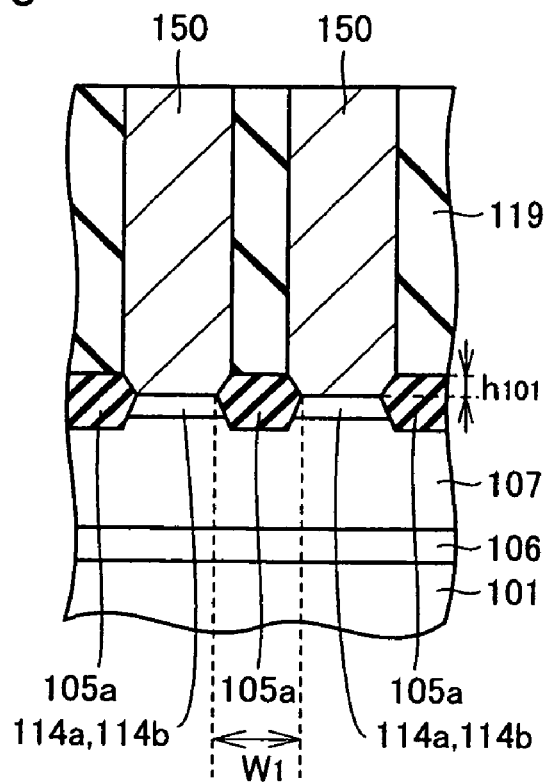
FIG. 18 is a cross-sectional view along the line XVIII-XVIII in FIG. 15.
Figure 19:
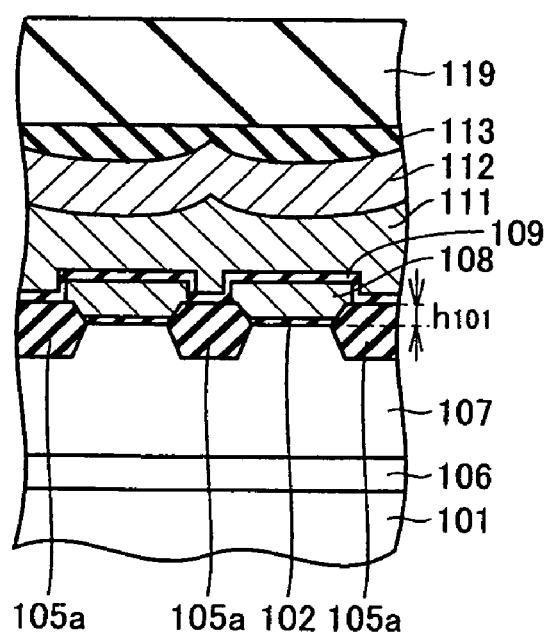
FIG. 19 is a cross-sectional view along the line XIX-XIX in FIG. 15.

Particularly referring to FIGS. 16 and 17, a prescribed P-type well 107 and an embedded N-type well 106 are formed on a surface of a silicon substrate 101. The surface of silicon substrate 101 is divided into the memory cell area and the peripheral circuit area by an isolation structure 105. When viewed two-dimensionally, the boundary between the memory cell area and the peripheral circuit area is present within isolation structure 105.

Isolation structure 105 has a portion 105a in the memory cell area having depth $d_1$ and a portion 105b in the peripheral circuit area having depth $d_2$. There is a step at the boundary between portion 105a having depth $d_1$ and portion 105b having depth $d_2$. In addition, an isolation height $h_{101}$ (FIG. 18) of isolation structure 105a in the memory cell area is substantially the same as an isolation height $h_{102}$ (FIG. 21) of an isolation structure 105b in the peripheral circuit area.

In an element forming area S i defined by isolation structure 105a in the memory cell area, gate structures 132, 133 of memory cell transistors (first gate structure) are formed. In gate structures 132, 133 of memory cell transistors, floating gate electrodes (lower electrode) implemented by a polysilicon film 108 (first conductive film) are formed on silicon substrate 101, with a silicon oxide film 102 (first gate insulating film) being interposed.

A control gate electrode (upper electrode) implemented by a polysilicon film 111 and a tungsten silicide film 112 (second conductive film) is formed on the floating gate electrode, with an ONO film 109 (insulating film) being interposed. A silicon oxide film 113 is formed on tungsten silicide film 112. It is noted that ONO film 109 is a stacked-layer film in which a silicon oxide film is formed on a silicon oxide film with a silicon nitride film being interposed. In addition, on the surface of silicon substrate 101, a low-concentration impurity region 114a and a high-concentration impurity region 114b serving as a drain region of the memory cell transistor and a source region 115 are formed.

In an element forming area S2 defined by isolation structure 105b in the peripheral circuit area, gate structures 134, 135 of transistors for the peripheral circuit (second gate structure) are formed. In gate structures 134, 135 of transistors, gate electrodes implemented by polysilicon film 111 and tungsten silicide film 112 are formed on silicon substrate 101, with a silicon oxide film 110 (second gate insulating film) being interposed. Silicon oxide film 113 is formed on tungsten silicide film 112. In addition, source/drain regions 116, 117 of the transistor are formed on the surface of silicon substrate 101.

A dummy gate structure 131 (third gate structure) having a prescribed positional relation with the end portions of isolation structure 105 is formed on isolation structure 105. Dummy gate structure 131 is formed astride the memory cell area and the peripheral circuit area. In dummy gate structure 131, polysilicon film 108 is formed on silicon substrate 101 in the memory cell area, and ONO film 109 is formed so as to cover an upper portion and a side portion of polysilicon film 108. In addition, polysilicon film 111 and tungsten silicide film 112 are formed so as to cover ONO film 109. Polysilicon film 111 and tungsten silicide film 112 are formed astride the memory cell area and the peripheral circuit area. Silicon oxide film 113 is formed on tungsten silicide film 112.

A sidewall oxide film 118 is formed on each side surface of gate structures 132, 133 of memory cell transistors, gate structures 134, 135 of transistors and dummy gate structure 131. In addition, an interlayer insulating film 119 is formed on silicon substrate 101, so as to cover gate structures 132, 133 of memory cell transistors, gate structures 134, 135 of transistors and dummy gate structure 131.

As shown in FIG. 17, in interlayer insulating film 119, a contact 150 electrically connecting low-concentration impurity region 114a and high-concentration impurity region 114b in the memory cell area to an upper interconnection (not shown) and a contact 151 electrically connecting source/drain regions 116, 117 in the peripheral circuit area to an upper interconnection (not shown) are formed.

Figure 15:
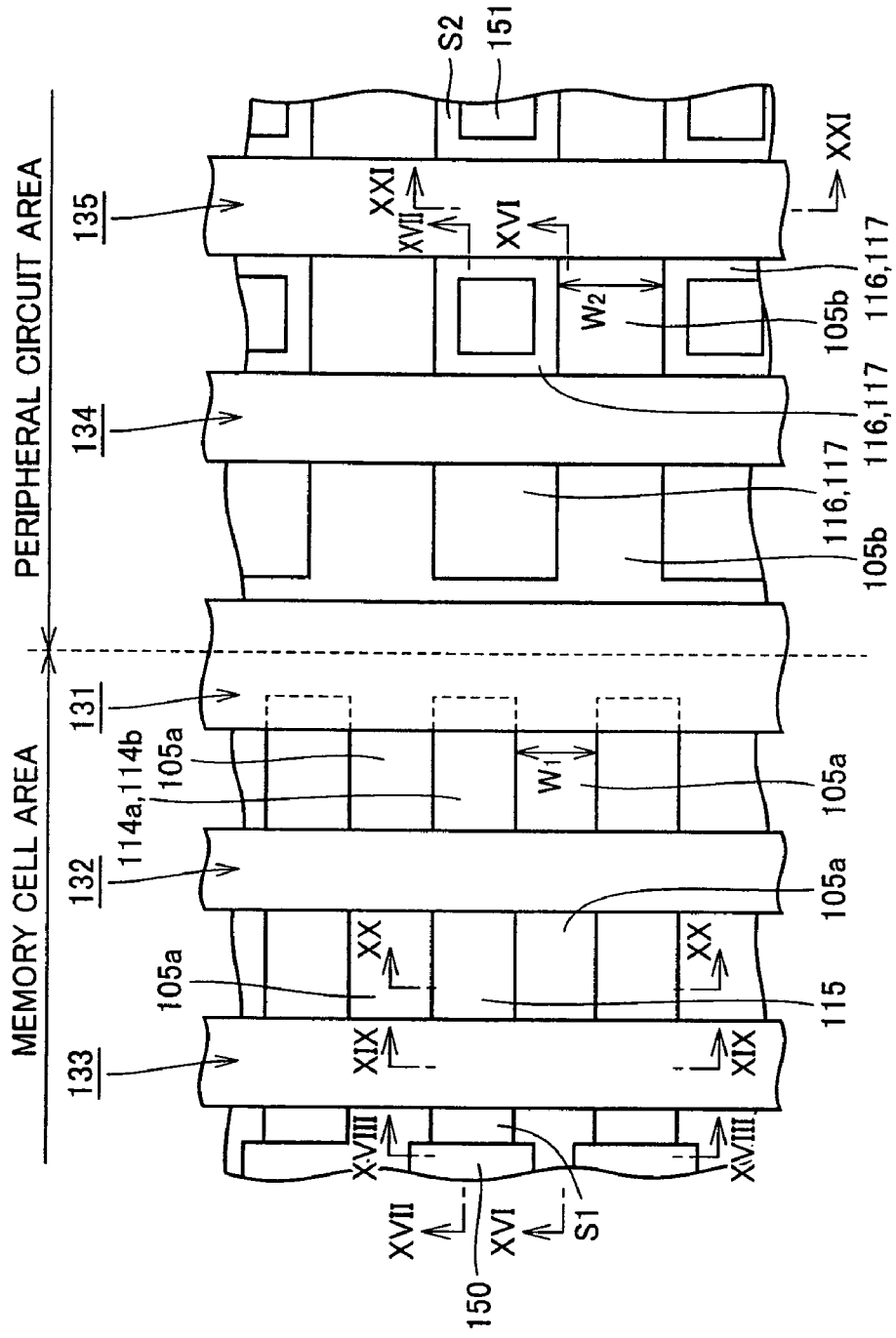
FIG. 15 is a plan view showing a structure around a boundary between a memory cell area and a peripheral circuit area in a flash memory in a third embodiment of the present invention.

In the semiconductor device according to the present embodiment, particularly as shown in FIG. 15, a trench width $W_1$ of isolation structure 105a in the memory cell area is narrower than a trench width $W_2$ of isolation structure 105b in the peripheral circuit area.

Particularly as shown in FIGS. 16 and 17, dummy gate structure 131 and isolation structure 105 are formed such that a position of each end portion of dummy gate structure 131 does not coincide with a position of each end portion of isolation structure 105.

In addition, a film thickness of polysilicon film 108 in the memory cell area is substantially the same as that in dummy gate structure 131, each film thickness of polysilicon film 111 and tungsten silicide film 112 in the memory cell area, the peripheral circuit area and dummy gate structure 131 is substantially the same as that in the peripheral circuit area, and a film thickness of silicon oxide film 102 is different from a film thickness of silicon oxide film 110.

A method of manufacturing the semiconductor device according to the present embodiment will now be described with reference to FIGS. 22 to 28. FIGS. 22 to 28 are cross-sectional views corresponding to FIG. 17.

Figure 22:
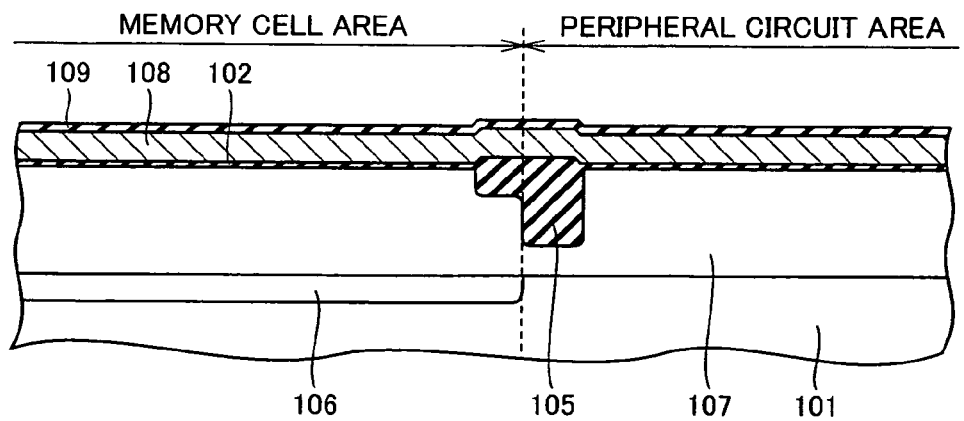
FIGS. 22 to 28 are cross-sectional views sequentially showing a method of manufacturing a semiconductor device in the third embodiment of the present invention.

Initially, as shown in FIG. 22, with the method similar to that in the first and second embodiments, isolation structure 105 is formed in a prescribed area on the surface of silicon substrate 101. Detailed method of forming isolation structure 105 will not be repeated.

Sacrificial oxide film 102 is formed on a main surface of silicon substrate 101, for example, using thermal oxidation or the like. Then, impurity ions are implanted into the prescribed area on the surface of silicon substrate 101 through sacrificial oxide film 102, and heat treatment is performed so as to form P-type well 107 and embedded N-type well 106. Thereafter, sacrificial oxide film 102 is removed, and the surface of silicon substrate 101 is subjected to oxidation. Then, silicon oxide film 102 is newly formed.

Thereafter, polysilicon film 108 is formed on silicon oxide film 102, for example, by CVD. Then, after polysilicon film 108 is etched away so as to remain on the active region of the memory cell (not shown), polysilicon film 108 is subjected to oxidation to form a silicon oxide film on the surface of polysilicon film 108. Then, a silicon oxide film is formed on the silicon oxide film with a silicon nitride film being interposed, thereby forming ONO film 109.

Figure 23:
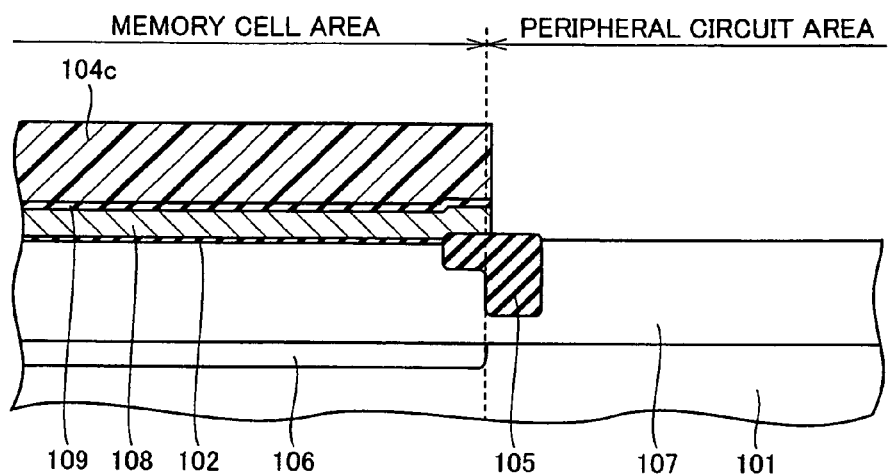

Thereafter, as shown in FIG. 23, a photoresist pattern 104c is formed on ONO film 109 in the memory cell area. Then, ONO film 109 and polysilicon film 108 are anisotropically etched, using photoresist pattern 104c as a mask. In this manner, ONO film 109 and polysilicon film 108 are formed solely in the memory cell area. In addition, exposed silicon oxide film 102 is removed. In this manner, the surface of silicon substrate 101 is exposed in the peripheral circuit area, and gate insulating film 102 is formed solely in the memory cell area. Thereafter, photoresist pattern 104c is removed.

Figure 24:
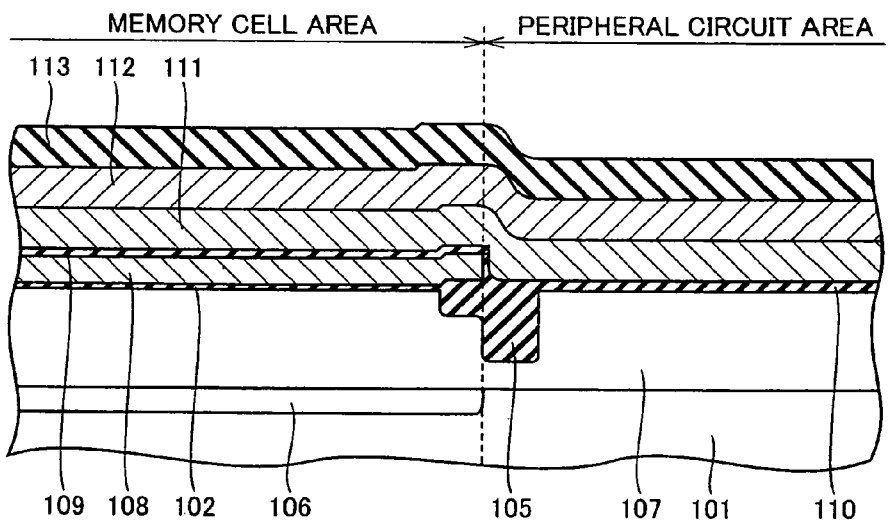

Thereafter, as shown in FIG. 24, the surface of silicon substrate 101 is subjected to oxidation so as to form silicon oxide film 110 on the surface of silicon substrate 101 in the peripheral circuit area. Then, polysilicon film 111 is formed on ONO film 109 and silicon oxide film 110 astride the memory cell area and the peripheral circuit area, for example, by using CVD. Thereafter, tungsten silicide film 112 is formed on polysilicon film 111, and silicon oxide film 113 is formed on tungsten silicide film 112.

Figure 25:
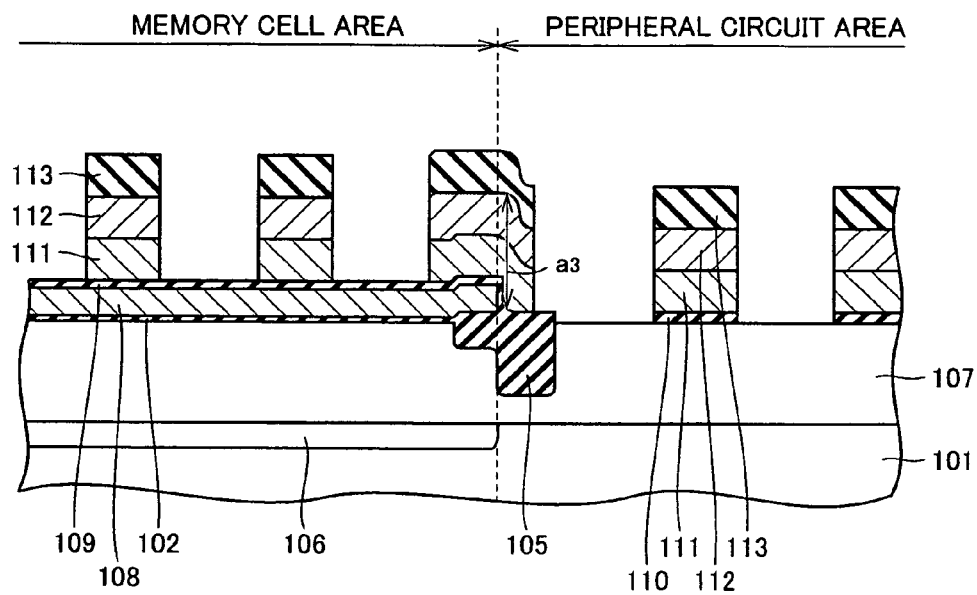

Thereafter, as shown in FIG. 25, a photoresist pattern (not shown) is formed on silicon oxide film 113, and using this photoresist pattern as a mask, silicon oxide film 113 is anisotropically etched, whereby silicon oxide film 113 is patterned. Thereafter, the photoresist pattern is removed. Then, using patterned silicon oxide film 113 as a mask, tungsten silicide film 112 and polysilicon film 111 are anisotropically etched.

As a result of anisotropic etching, the control gate electrode implemented by polysilicon film 111 and tungsten silicide film 112 is formed on ONO film 109 in the memory cell area. In addition, the gate electrode implemented by polysilicon film 111 and tungsten silicide film 112 is formed on silicon oxide film 110 in the peripheral circuit area. Moreover, polysilicon film 111 and tungsten silicide film 112 implementing dummy gate structure 131 are formed on the boundary between the memory cell area and the peripheral circuit area. Thereafter, a prescribed ion implantation process is carried out, so as to form low-concentration N-type source/drain region 116 (see FIG. 26) in the peripheral area.

Figure 26:
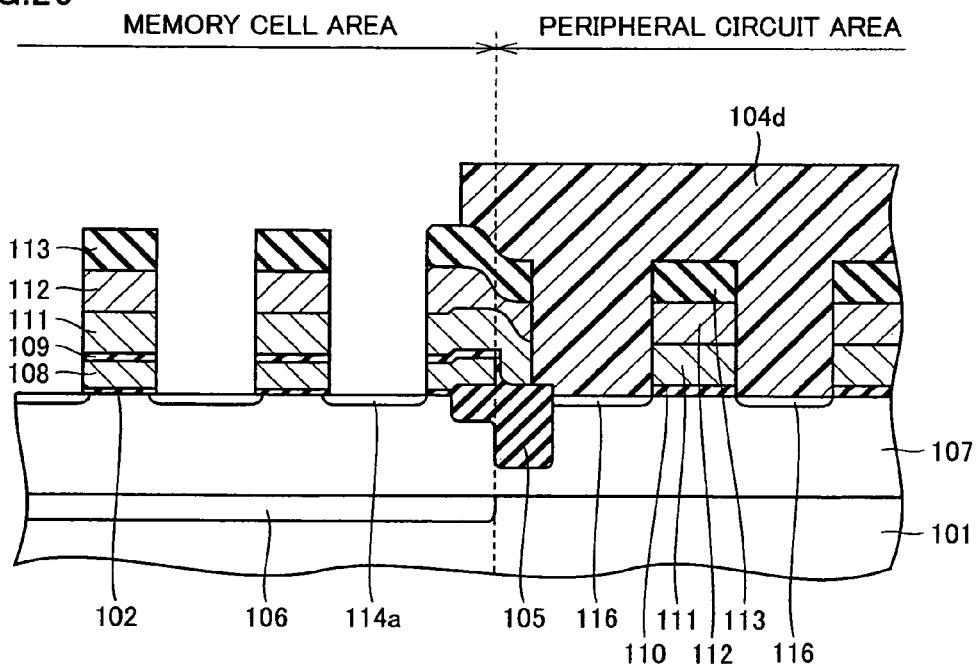

Thereafter, as shown in FIG. 26, a photoresist pattern 104d is formed. Using photoresist pattern 104d and patterned silicon oxide film 113 as a mask, ONO film 109 and polysilicon film 108 are anisotropically etched.

As a result of anisotropic etching, the floating gate electrode implemented by polysilicon film 108 is formed on silicon oxide film 102 in the memory cell area. In addition, ONO film 109 and polysilicon film 108 implementing the dummy gate structure 131 are formed in the memory cell area around the boundary between the memory cell area and the peripheral circuit area. Thereafter, a prescribed ion implantation process is carried out, so as to form low-concentration impurity region 114a serving as the drain region in an element forming area in the memory cell area. Thereafter, photoresist pattern 104d is removed.

Figure 27:
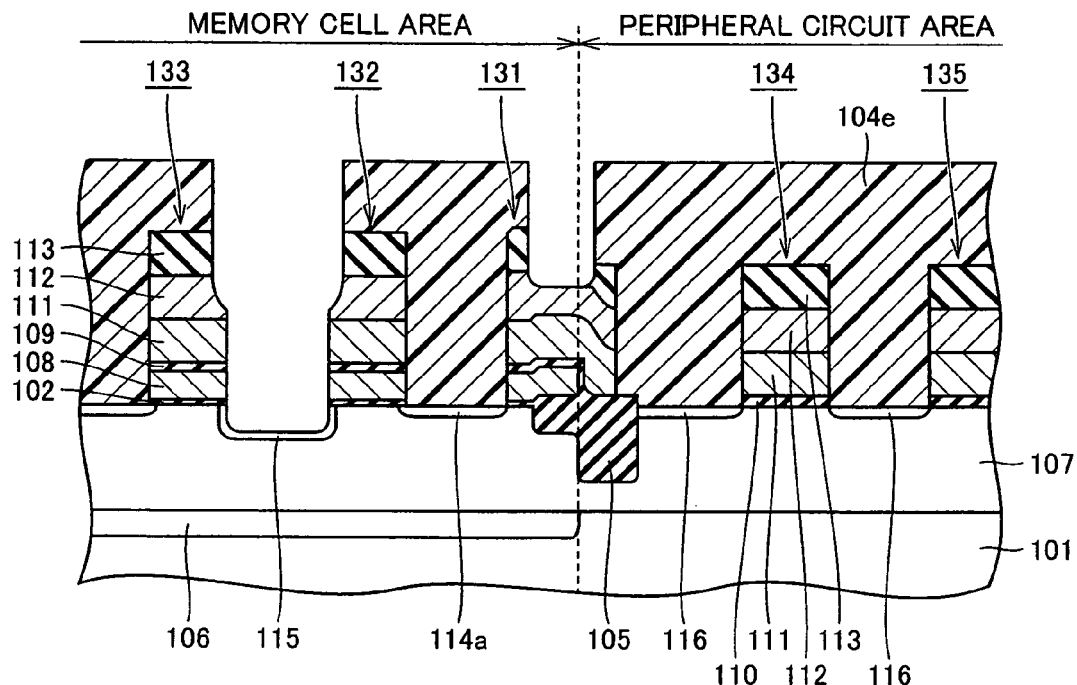

Thereafter, as shown in FIG. 27, a photoresist pattern 104e is formed. Using photoresist pattern 104e as a mask, exposed silicon substrate 101 is etched. Thereafter, the surface of silicon substrate 101 is subjected to a prescribed ion implantation process, so as to form source region 115 in the memory cell area. Thereafter, photoresist pattern 104e is removed.

In this manner, gate structures 132, 133 of memory cell transistors are formed in the memory cell area, while gate structures 134, 135 of transistors for a peripheral circuit are formed in the peripheral circuit area. In addition, dummy gate structure 131 is formed on isolation structure 105, astride the memory cell area and the peripheral circuit area.

Figure 28:
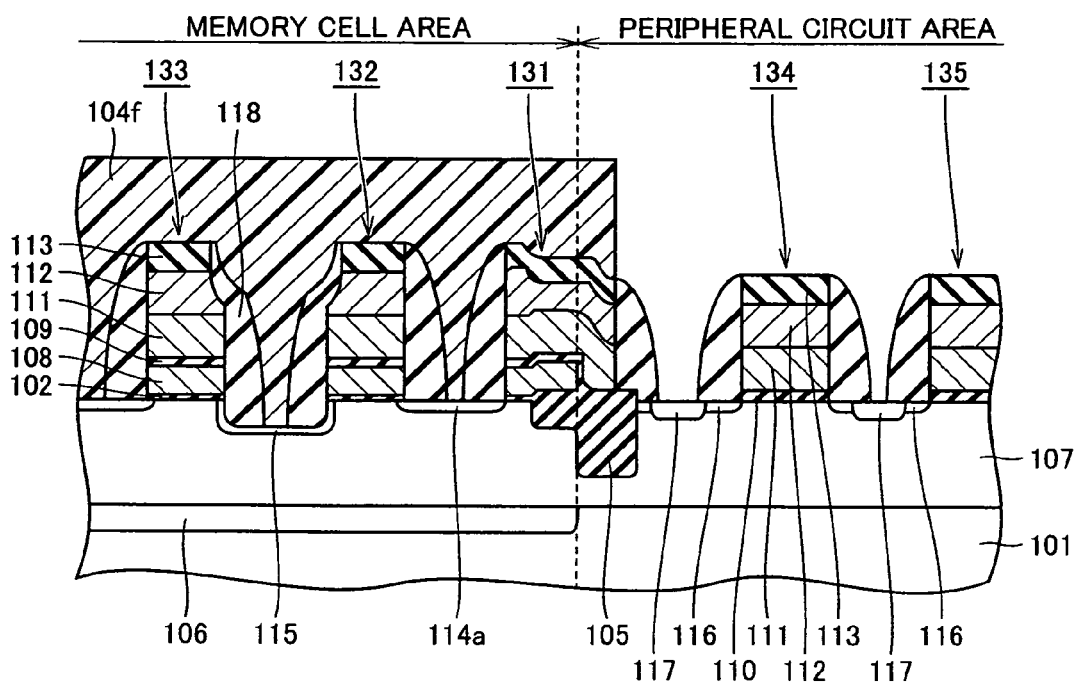

Thereafter, as shown in FIG. 28, a TEOS film (not shown) is formed so as to cover each of gate structures 132, 133 of memory cell transistors, gate structures 134, 135 of transistors and dummy gate structure 131. The TEOS film is subjected to dry etching process, so as to form each sidewall oxide film 118. Then, a photoresist pattern 104f is formed. Using photoresist pattern 104f and sidewall oxide film 118 as a mask, the surface of silicon substrate 101 is subjected to a prescribed ion implantation process. In this manner, high-concentration N-type source/drain region 117 is formed in the peripheral circuit area. Thereafter, photoresist pattern 104f is removed. In addition, using sidewall oxide film 118 as a mask, the surface of silicon substrate 101 is subjected to a prescribed ion implantation process in the memory cell area. Then, high-concentration impurity region 114b is formed in the memory cell area (FIG. 17).

Thereafter, referring to FIG. 17, interlayer insulating film 119 including the TEOS film and a BPTEOS (Boro Phospho Tetra Ethyl Ortho Silicate glass) film is formed to cover each of gate structures 132, 133 of memory cell transistors, gate structures 134, 135 of transistors and dummy gate structure 131. Thereafter, contact 150 connecting low-concentration impurity region 114a and high-concentration impurity region 114b in the memory cell area and contact 151 connecting source/drain regions 116, 117 in the peripheral circuit area are formed. The semiconductor device shown in FIG. 17 is thus completed.

According to the semiconductor device and the manufacturing method in the present embodiment, in addition to the effect described in the first and second embodiments, the following effect can be achieved.

Specifically, as shown in FIG. 25, dummy gate structure 131 is provided on the boundary between the memory cell area and the peripheral circuit area, and a memory cell area side of dummy gate structure 131 has such a structure that polysilicon film 108 implementing the floating gate electrode and polysilicon film 111 and tungsten silicide film 112 implementing the control gate electrode are stacked. Polysilicon film 111 and tungsten silicide film 112 are formed to cover the end portion of polysilicon film 108.

With such a structure, the control gate electrode portion formed to cover the end portion of the floating gate electrode (polysilicon film 108) does not need to be etched. That is, it is not necessary to etch a large thickness portion as shown with $a_3$ in FIG. 25. Therefore, when polysilicon film 111 and tungsten silicide film 112 serving as the control gate electrode in the memory cell area and the gate electrode in the peripheral circuit area are etched, residue of polysilicon film 111 and tungsten silicide film 112 at the end portion of the floating gate electrode can be prevented.

In addition, as shown in FIG. 26, when solely the peripheral circuit area is covered with photoresist pattern 104d as well, abnormal shape of silicon substrate 101 or of isolation structure 105 due to unnecessary over-etching can be prevented, by arranging the boundary between the memory cell area and the peripheral circuit area on dummy gate structure 131.

Moreover, as the boundary between the shallow trench of isolation structure 105a and the deep trench of isolation structure 105b may cause a defect such as current leakage due to crystal defect originating from the step on the bottom of the trench, such an area is not suitable for element formation. Accordingly, the boundary between the shallow trench and the deep trench is arranged in a manner superposed on dummy gate structure 131, so that areas not suitable for element formation are superposed. An element can thus be reduced in size.

The boundary between the memory cell area and the peripheral circuit area may be arranged on a dummy active region (an active region where transistors 9a to 9g are not formed in FIG. 1) as in the first embodiment. Meanwhile, in the present embodiment, the boundary between the memory cell area and the peripheral circuit area is arranged on isolation structure 105, so that the end portion of the floating gate electrode (polysilicon film 108) is located on isolation structure 105, as shown in FIG. 23. Then, scrape-out of silicon substrate 101 due to over-etching during etching of the floating gate can be prevented. That is, when the boundary is superposed on the dummy active region, the boundary should be arranged distant from the end portion of the floating gate electrode, in order to prevent scrape-out of silicon substrate 101. In such a case, an element area is increased. Therefore, in order to reduce the element in size, it is preferable to arrange the boundary on the isolation structure.

Furthermore, gate structures 133, 132 of memory cell transistors are opposed to silicon substrate 101, with gate insulating film 102 being interposed. Therefore, stress of the gate electrode tends to be applied to the memory cell area or the like, and crystal defect is likely in the memory cell area or the like.

In the present embodiment, the end portion of dummy gate structure 131 on the memory cell area side is located more distant from the boundary (on the element forming area within the memory cell area) than the corresponding end portion of isolation structure 105a, and the end portion thereof on the peripheral circuit area side is located closer to the memory cell area side (on isolation structure 105) than the corresponding end portion of isolation structure 105a.

In particular, as a result of forming dummy gate structure 131 in the above-described manner, crystal defect that occurs in a portion of silicon substrate 101 located in the vicinity of isolation structure 105 can significantly be suppressed as compared with the conventional semiconductor device.

In the present embodiment, the end portions of dummy gate structure 131 are both displaced toward the memory cell side, however, they may be displaced toward the peripheral circuit area side. A similar effect can be obtained, so long as the end portion of the dummy gate structure or the end portion of the element isolation area is displaced toward either side.

Figure 20:
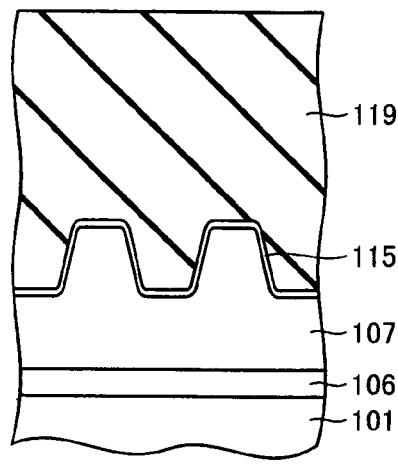
FIG. 20 is a cross-sectional view along the line XX-XX in FIG. 15.
Figure 21:
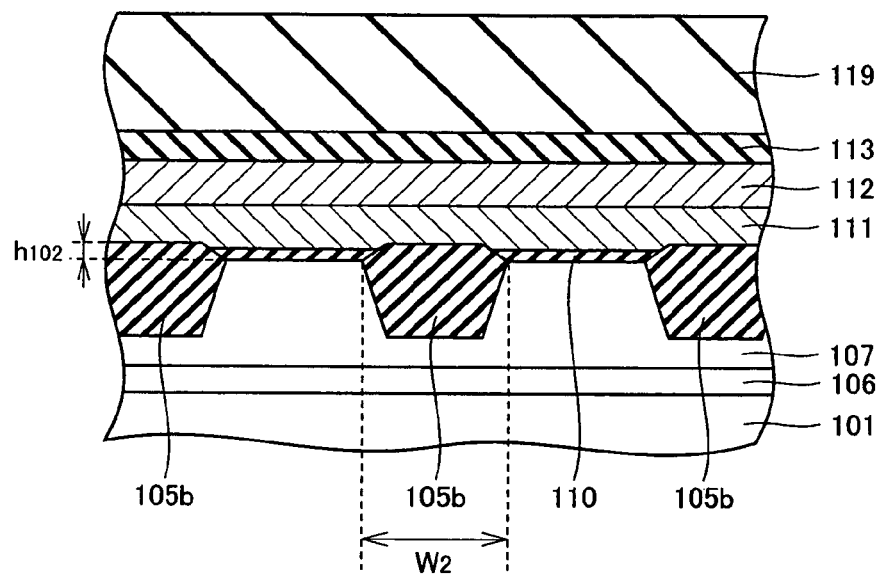
FIG. 21 is a cross-sectional view along the line XXI-XXI in FIG. 15.

In the present embodiment, as the depth of the isolation structure in the memory cell area is made smaller than that in the peripheral circuit area, insufficient burying of the isolation structure is less likely. In addition, as shown in FIG. 20, as source region 115 formed by removing the isolation structure can be formed to have a small depth, a problem that desired implantation cannot be achieved due to an influence of shadowing at the time of ion implantation can be avoided, and a resistance of source region 115 can be lowered.

Here, as in the first embodiment, a problem that arises in a conventional example in which the silicon oxide film is not formed on the silicon nitride film will be described in detail with reference to FIGS. 29 to 32. It is noted that FIG. 29 corresponds to FIG. 18 in the present embodiment.

Figure 29:
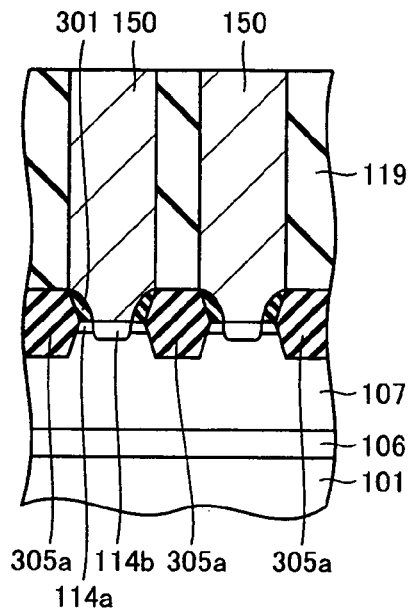
FIG. 29 is a cross-sectional view of a semiconductor device when a silicon oxide film is not formed on a silicon nitride film.
Figure 30:
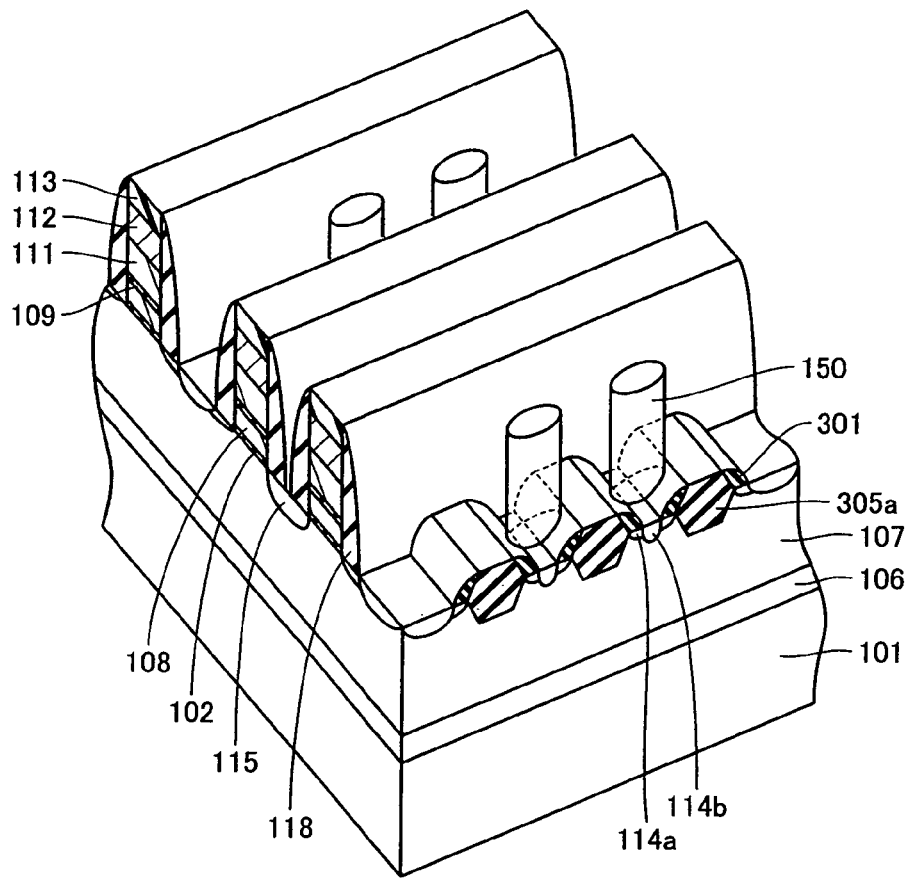
FIG. 30 is a perspective view of a semiconductor device when a silicon oxide film is not formed on a silicon nitride film.

According to the conventional method, there is a great difference in the height of the isolation structure between the memory cell area and the peripheral circuit area. As such, the height of the isolation structure in the peripheral circuit area is set so as not to be lower than the silicon substrate. Then, as shown in FIGS. 29 and 30, the height of an isolation structure 305a in the memory cell area becomes extremely high. If the height of isolation structure 305a is extremely high, in forming sidewall oxide film 118, a sidewall oxide film 301 is formed also on the side surface of isolation structure 305a that protrudes from silicon substrate 101. Consequently, a contact area between contact 150 and silicon substrate 101 is made smaller due to presence of sidewall oxide film 301, and contact resistance between contact 150 and silicon substrate 101 becomes higher. In the semiconductor device according to the present embodiment, as the height of the isolation structure in the memory cell area is substantially the same as that in the peripheral circuit area, such a problem is not caused. Therefore, reliability and performance of a semiconductor device can be improved.

Figure 31:
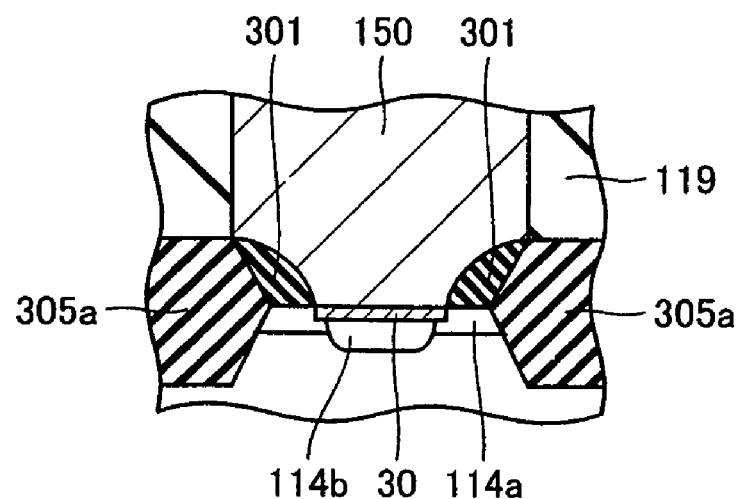
FIG. 31 is an enlarged cross-sectional view of a state in which a silicide layer is formed in the semiconductor device when a silicon oxide film is not formed on a silicon nitride film.
Figure 32:
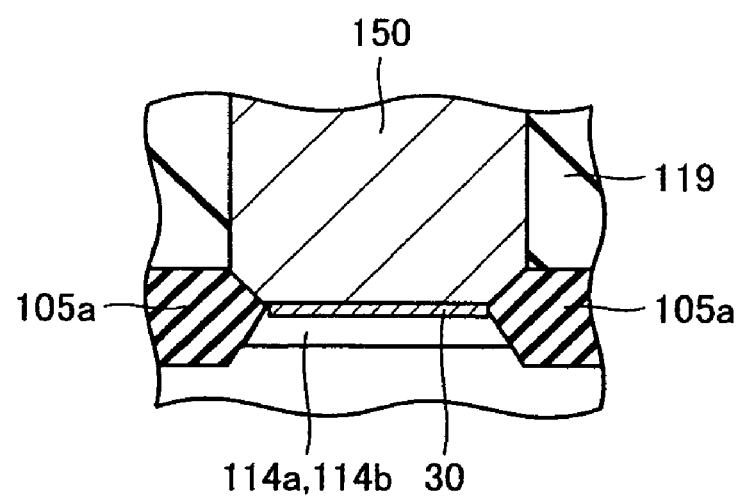
FIG. 32 is an enlarged cross-sectional view of a state in which a silicide layer is formed in the semiconductor device in the third embodiment of the present invention.

When a high-speed logic circuit or the like is formed in the peripheral circuit area, the substrate surface may be silicided so as to achieve low resistance. In such a case, as shown in FIG. 31, using sidewall oxide film 301 as a mask, high-concentration impurity region 114b is formed within low-concentration impurity region 114a, and thereafter, the silicon substrate surface in an area where sidewall oxide film 301 slightly retreated as a result of a cleaning process or the like is silicided, to form a silicide layer 30. Here, a problem of occurrence of leakage due to contact between silicide layer 30 and low-concentration impurity region 114a is caused. In the present embodiment, however, as shown in FIG. 32, as the sidewall oxide film is not formed on the side surface of isolation structure 105, such a problem does not occur in spite of formation of silicide layer 30.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a first area and a second area, comprising the steps of:

forming a first silicon insulating film over a silicon substrate;

forming a first trench in said first silicon insulating film and said silicon substrate in said first area and a second trench in said first silicon insulating film and said silicon substrate in said second area;

forming a mask layer in said first trench formed in said first area and over said first silicon insulating film in said first area;

etching said silicon substrate using said mask layer and said first silicon insulating film as a mask, so as to form said second trench deeper than said first trench and remove an upper portion of said first silicon insulating film in said second area;

removing said mask layer;

forming a second silicon insulating film over said first silicon insulating film so as to bury said first and said second trenches; and removing both said first and said second silicon insulating films over said silicon substrate so as to form an isolation structure in said first and said second trenches, wherein said step of forming said first trench and said second trench includes a step of forming a third trench at a boundary between said first area and said second area and said third trench has a first portion in said first area and a second portion in said second area, said step of etching said silicon substrate includes a step of etching said silicon substrate using said mask layer and said first silicon insulating film as a mask, so as to form said second portion of said third trench in said second area which has a substantially same depth as said second trench, and after said step of etching said silicon substrate, said third trench has said first portion having a substantially same depth as said first trench and said second portion having a substantially same depth as said second trench.

2. The method of manufacturing a semiconductor device according to claim 1, further comprising the steps of:

forming a first gate insulating film over said silicon substrate in said first area;

forming a first conductive film over said first gate insulating film;

forming an insulating film over said first conductive film;

forming a second gate insulating film over said silicon substrate in said second area;

forming a second conductive film over said insulating film and said second gate insulating film;

etching said second conductive film to leave at least said second conductive film present at a boundary between said first area and said second area, so as to form an upper electrode on said insulating film in said first area, to form a gate electrode on said second gate insulating film in said second area, and to form said second conductive film implementing a gate structure at the boundary between said first area and said second area; and etching said insulating film and said first conductive film, so as to form a lower electrode over said first gate insulating film and to form said insulating film and said first conductive film implementing the gate structure in said first area around said boundary.

3. The method of manufacturing a semiconductor device according to claim 1, wherein said step of forming a mask layer includes the step of forming said mask layer in said first portion of said third trench.

4. The method of manufacturing a semiconductor device according to claim 1, further comprising the step of forming a silicon nitride film over said silicon substrate prior to the step of forming said first silicon insulating film, wherein said step of removing both said first and said second insulating films includes the step of removing both said first and second silicon insulating films by chemical mechanical polishing; and stopping said polishing by using said silicon nitride film as a stopper layer.

* * * * *